United States Patent
Nagarakanti et al.

(10) Patent No.: US 7,372,341 B2
(45) Date of Patent: May 13, 2008

(54) NOISE IMMUNITY CIRCUITRY FOR PHASE LOCKED LOOPS AND DELAY LOCKED LOOPS

(75) Inventors: Kailashnath Nagarakanti, Santa Clara, CA (US); Kiritkumar Panchal, Sunnyvale, CA (US); Sung-Hun Oh, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 89 days.

(21) Appl. No.: 11/411,186

(22) Filed: Apr. 25, 2006

(65) Prior Publication Data

US 2007/0247251 A1    Oct. 25, 2007

(51) Int. Cl.
*H03B 1/00* (2006.01)

(52) U.S. Cl. .................. 331/74; 331/175; 331/185; 331/16; 327/156; 327/158; 327/159

(58) Field of Classification Search .............. 331/57, 331/185, 16, 74, 175; 327/156, 158, 159
See application file for complete search history.

(56) References Cited

U.S. PATENT DOCUMENTS

| | | | |
|---|---|---|---|
| 6,489,822 B2 | 12/2002 | Han | |
| 6,873,214 B2 * | 3/2005 | Harwood | 331/17 |
| 6,894,546 B2 | 5/2005 | Mika | |
| 6,952,125 B2 | 10/2005 | Ahn | |
| 6,998,923 B2 | 2/2006 | Melanson | |
| 7,034,590 B2 | 4/2006 | Shin | |
| 7,256,657 B2 * | 8/2007 | Sanchez et al. | 331/34 |

* cited by examiner

*Primary Examiner*—Arnold Kinkead
(74) *Attorney, Agent, or Firm*—Meyertons Hood Kivlin Kowert & Goetzel, P.C.; Eric A. Heter

(57) ABSTRACT

A clock circuit. The clock circuit includes a phase detector and an output unit. The phase detector is coupled to receive a reference clock signal and an output clock signal, and is configured to provide a phase signal indicative of a phase difference between the reference and output clock signals. The output unit is configured to provide the output clock signal, and is coupled to a first supply voltage node and a second supply voltage node. The output unit includes a biasing circuit and a voltage-controlled element. The biasing circuit is coupled to receive a control voltage based on the phase signal and is configured to generate a bias voltage based on the received control voltage. The voltage-controlled element is configured to adjust a parameter of the output clock signal based on the bias voltage. A supply-independent output clock is attained using this configuration.

18 Claims, 3 Drawing Sheets

NOISE IMMUNITY CIRCUITRY FOR PHASE LOCKED LOOPS AND DELAY LOCKED LOOPS

BACKGROUND OF THE INVENTION

1. Field of the Invention

This invention relates to electronic circuits, and more particularly to clock generation circuits such as phase locked loops and delay locked loops.

2. Description of the Related Art

Phase-locked loops (PLL's) and/or delay-locked loops (DLL's) are commonly used to provide clock signals in digital circuits. A typical PLL or DLL includes a phase detector and a voltage-controlled element (VCE). In a PLL, the voltage-controlled element is a voltage-controlled oscillator (VCO) that outputs a frequency that is proportional to a received input voltage. In a DLL, the voltage-controlled element is a voltage-controlled delay line (VCDL), which delays a clock signal in proportion to a received input voltage.

In digital integrated circuits, PLL's and DLL's may suffer from various noise sources, including input clock noise and power supply noise. These noise sources can produce an unwanted variation in the timing of signals commonly referred to as jitter. In larger, more complex digital systems, the effect of power supply noise on an output clock signal provided by a PLL/DLL may be significant.

Various techniques have been employed to minimize the effects of jitter resulting from power supply noise. One such technique is to implement the circuit (particularly the VCE of a PLL or DLL) using differential amplifiers with symmetric load architecture as a delay element in order to reject power supply noise that appears as common-mode noise. This technique may provide excellent noise rejection characteristics. However, the maximum operating speed may be limited for PLL's and DLL's implemented using this architecture. For digital integrated circuits with clock speeds in the gigahertz range, this architecture may be unsuitable.

Another technique that may be more suitable for high-speed digital integrated circuits is to provide an additional on-chip DC-DC voltage regulator to provide a clean power supply for the PLL/DLL. However, this technique is significantly more complex than using the differential architecture discussed above, and requires additional circuit area. The additional complexity includes the necessity to provide a bandgap circuit for providing a constant voltage reference. The bandgap reference requires parasitic bipolar devices implemented in a CMOS process. Thus, while this technique may be suitable for high-speed digital designs, it involves significant overhead in design complexity, and circuit area.

SUMMARY OF THE INVENTION

A clock circuit is disclosed. In one embodiment, the clock circuit includes a phase detector, a charge pump, a (low-pass) filter, and an output unit. The phase detector is coupled to receive a reference clock signal and an output clock signal, and is configured to provide a phase signal indicative of a phase difference between the reference and output clock signals. The phase detector is coupled in cascade to a charge pump and a (low-pass) filter. This circuit converts the input phase difference (as indicated by the phase signal) into a control voltage which is provided to the output unit. The output unit is configured to provide the output clock signal, and is coupled to a first supply voltage node (a source) and a second supply voltage node (a sink). The output unit includes a biasing circuit and a voltage-controlled element. The biasing circuit is coupled to receive a control voltage based on the phase signal and is configured to generate a bias voltage based on the received control voltage. The voltage-controlled element is coupled to receive a first supply voltage (from the first supply voltage node) and the bias voltage, and is configured to adjust a parameter of the output clock signal based on the bias voltage, and more particularly, on the difference between the first supply voltage and the bias voltage. The bias voltage is effectively decoupled from the second supply voltage, and thus leaving the parameters of the output clock signal independent of the power supply.

In one embodiment, the clock circuit is a single-ended clock circuit. That is, each of the signals (clock signals and voltage signals) is a single-ended signal. The clock circuit may be either a delay locked loop or a phase locked loop. In the case where the clock circuit is a delay locked loop, the voltage-controlled element is a voltage controlled delay line configured to adjust the delay of the output clock signal with respect to the reference clock signal. In the case where the clock circuit is a phase locked loop, the voltage-controlled element is a voltage-controlled oscillator configured to provide an output clock signal having a frequency that is a multiple of the input or reference clock frequency by using a frequency divider in the feedback path.

The clock circuit may include a charge pump. The charge pump may be coupled to receive the phase signal from the phase detector, and may be configured to generate the control voltage based on the phase signal. The control voltage may be received on an inverting input of an amplifier in the biasing circuit.

BRIEF DESCRIPTION OF THE DRAWINGS

Other aspects of the invention will become apparent upon reading the following detailed description and upon reference to the accompanying drawings in which.

Figure 1A:
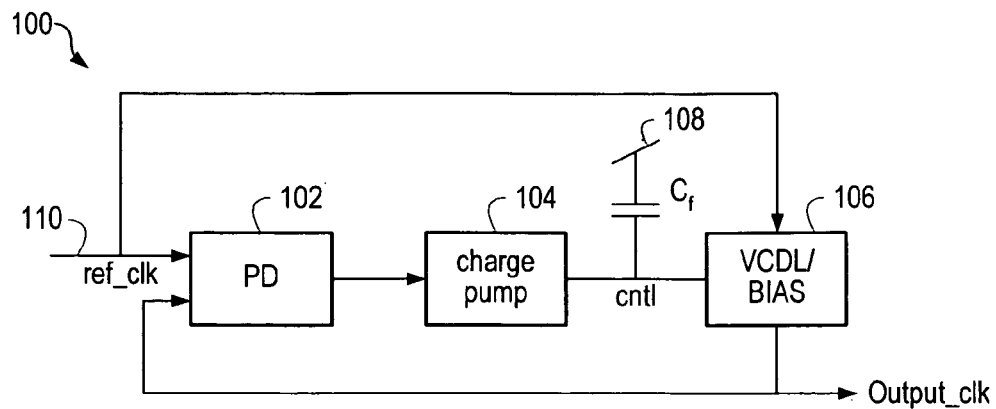
FIG. 1A is a block diagram of one embodiment of a delay locked loop.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1A, a block diagram of one embodiment of a delay locked loop is shown. In the embodiment shown, delay locked loop (DLL) 100 includes a phase detector 102, a charge pump 104, and an output unit 106. Charge pump 104 is coupled to receive a phase signal from phase detector 102, and is further coupled to provide a control voltage to output unit 106. Low-pass filtering may be provided, at least in part, by filter capacitor $C_f$, which is coupled between a first voltage node 108 (e.g., $V_{DD}$) and the control voltage node ('cntl'). The filtered control voltage is received by output unit 106, which in this embodiment includes a voltage-controlled delay line (VCDL) and a biasing circuit. In this particular embodiment, each component of DLL 100 is configured for single-ended signaling. Embodiments utilizing differential signaling are also possible and contemplated, and thus the circuits shown herein may be considered to be either single-ended or differential circuits.

Phase detector 102 coupled to receive a reference clock and an output clock. Phase detector 102 is configured to generate a phase signal (i.e., an error signal) indicative of a phase difference, if any, between the reference clock signal and the output clock signal. The phase signal may be a voltage signal that varies according to the phase difference between the reference clock signal and the output clock signal. Alternatively, the phase signal may comprise separate up and down signals. In general, phase detector 102 may be one of several different types of phase detectors that are well known in the art.

As previously noted, charge pump 104 is coupled to receive the phase signal from phase detector 102. Responsive to the received phase signal, charge pump 104 is configured to generate a control voltage ('$V_{cntl}$'), which appears on the control voltage node. Charge pump 104 may also provide filtering in some embodiments. In general, charge pump 104 adjusts the charge on the capacitor in order to adjust the control voltage (and therefore, adjust the output clock signal). If the output clock signal has more delay than desired (or is too fast in the PLL embodiment to be discussed below), the charge pump allows capacitor $C_f$ to discharge somewhat until the appropriate control voltage is achieved. Similarly, if the output clock signal has too small a delay (or is too slow in the PLL embodiment), the charge pump adds charge to the capacitor in order to achieve the appropriate control voltage.

In the embodiment shown in FIG. 1A, output unit 106 includes a VCDL and a biasing circuit. The VCDL of output unit 106 is coupled to receive the reference clock signal and is configured to provide an output clock signal. The output clock signal is a delayed version of the reference clock signal. The amount of delay provided by the VCDL is controlled by adjustments to a bias voltage generated by the biasing circuit. The biasing circuit of output unit 106 is coupled to receive the control voltage from charge pump 104. The bias voltage is generated by the biasing circuit based on the received control voltage. Thus, the control voltage effectively controls the delay provided by the VCDL through the biasing circuit. The operation of the biasing circuit and of output unit 106 in general will be discussed in further detail below.

Figure 1B:
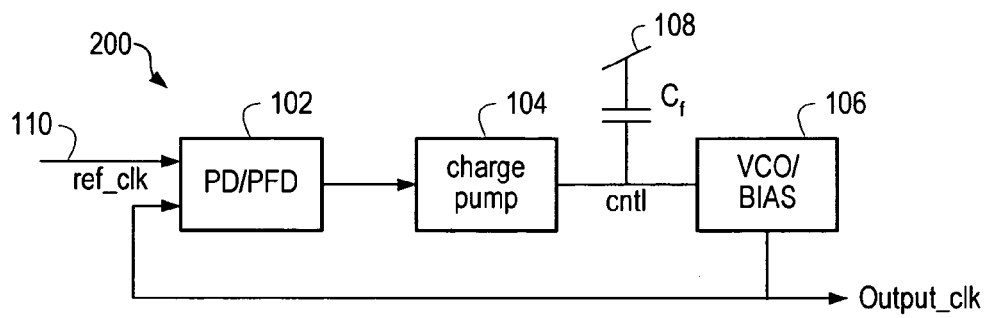
FIG. 1B is a block diagram of one embodiment of a phase locked loop.

FIG. 1B is a block diagram of one embodiment of a phase-locked loop. Phase-locked loop (PLL) 200 has an architecture similar to that of DLL 100 of FIG. 1A. Output unit 106 of PLL 200 comprises a biasing circuit and a voltage-controlled oscillator (VCO). The VCO is configured to provide an output clock signal at a frequency based on the biasing voltage provided by the biasing circuit. Thus, similar to the operation of the DLL of FIG. 1A, the control voltage effectively controls the frequency of the output clock signal through the biasing circuit.

Figure 2:
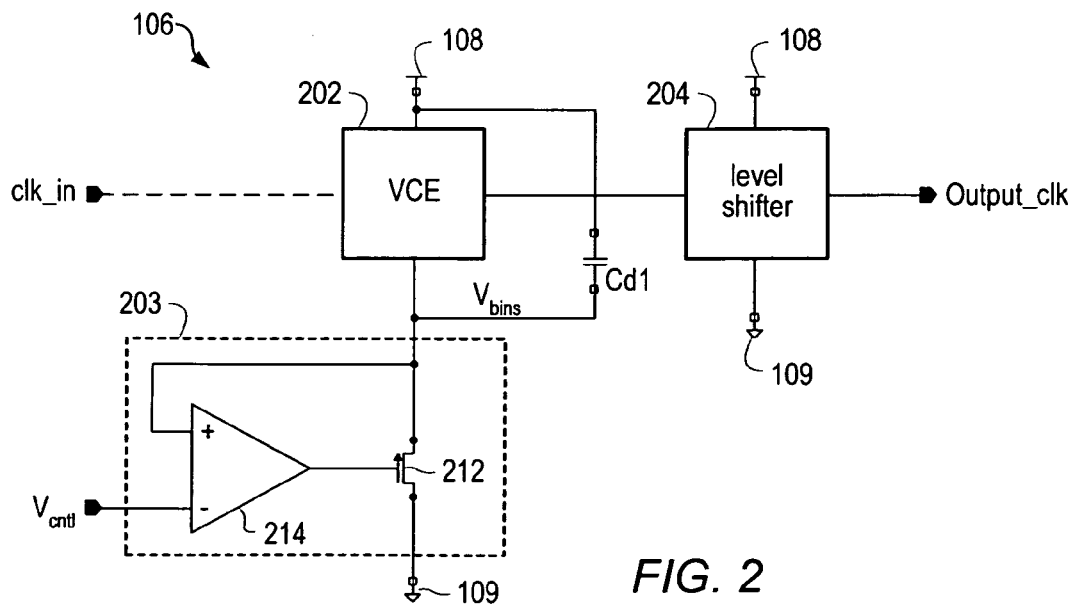
FIG. 2 is a diagram of one embodiment of an output unit of a clock circuit having a voltage-controlled element and a biasing circuit.

FIG. 2 is a diagram of one embodiment of an output unit of a clock circuit having a voltage-controlled element and a biasing circuit. In the embodiment shown, output unit 106 includes a voltage-controlled element (VCE) 202, a biasing circuit 203, and a level shifter 204. Level shifter 204 may shift the voltage levels of the output clock signal provided by VCE 202 to voltage levels that are appropriate for use in both the phase detector and the load serviced by the output clock signal. VCE 202 may be either a VCDL or a VCO, depending on whether output unit 106 is implemented in a DLL or a PLL. VCE 202 is coupled to receive the reference clock signal in the case where it is a VCDL.

A parameter of the VCE (e.g., delay for a VCDL, frequency for a VCO) may be adjusted based on the bias voltage. In one embodiment, the parameter may be proportional to the bias voltage itself, i.e. the delay (VCDL) or period (VCO) increases in proportion to the bias voltage. It is noted that when the period increases, the frequency decreases. It is further noted that in the embodiment shown, the frequency is proportional to the difference between the voltages present the first supply voltage node 108 and the bias voltage node (and thus, the frequency increase as the bias voltage decreases). Thus, the circuit may be configured such that the parameter is adjusted based on the voltage difference between a power supply node (first supply voltage node 108 in this case) and the bias voltage.

Output unit 106 is coupled to a first supply voltage node 108 (e.g., $V_{DD}$) and a second supply voltage node 109 (e.g., $V_{SS}$). For the purposes of this disclosure, first and second supply voltage nodes 108 and 109 will be referred to as $V_{DD}$ and $V_{SS}$ hereafter, although it is understood that other voltages (e.g., $V_{DD}$ and ground) may be present in other embodiments.

Biasing circuit 203 includes an amplifier 214 and transistor 212. Amplifier 214 is an operational amplifier having both an inverting input and a non-inverting input. The inverting input of amplifier 214 is coupled to receive the control voltage, while the non-inverting input is coupled to receive the bias voltage ('$V_{bias}$') as negative feedback. The output of amplifier 214 is coupled to the gate terminal of transistor 212. Based on the received control voltage and the bias voltage provided as feedback, amplifier 214 generates an output voltage which thereby controls transistor 212. Variations in the output voltage provided by amplifier 214 may vary the current through the channel of transistor 212 accordingly, as the amplifier attempts to drive the voltage difference between the inputs to zero. Thus, in the circuit arrangement shown, the bias voltage will track the control voltage provided to the inverting input of amplifier 214. If the control voltage increases, the bias voltage will increase accordingly, while the voltage drop across VCE 202 (i.e. the difference between $V_{DD}$ and $V_{bias}$) will decrease. If the control voltage decreases, the bias voltage will also decrease and the voltage drop across VCE 202 will increase. In either case, the output of VCE 202 will be adjusted accordingly.

The amount of current through transistor 212 (an n-channel transistor in this particular embodiment) is also affected by the difference between the gate and source voltages. It is noted that the gate-source voltage of the n-channel transistor must exceed the transistor's threshold voltage in order to turn the transistor on, i.e. $v_{gs} > v_t$. As is well known to those skilled in the art, operation in the triode region for an n-channel transistor is defined as $v_{ds} \leq v_{gs} - v_t$ (where $v_{ds}$ is the drain-source voltage, $v_{gs}$ is the gate-source voltage, and $v_t$ is the threshold voltage), while operation in the saturation region is defined as $v_{ds} \geq v_{gs} - v_t$. Since amplifier 214 is coupled in a negative feedback arrangement it will drive the output voltage so as to drive the difference between the inputs to zero, and thus will affect operation of transistor 212 accordingly. This may include turning the transistor on or off, operating the transistor in the triode region, or operating the transistor in the saturation region.

It should be noted that embodiments utilizing p-channel transistors are also possible and contemplated and may thus fall within the scope of the circuits described herein. In general, the circuit may be implemented using a variety of components, which may be of different polarity than those in the examples shown herein.

The circuit arrangement shown may effectively result in the bias voltage being effectively decoupled from $V_{SS}$. As shown in FIGS. 1A and 1B, the control voltage is referenced (via capacitor $C_f$) only to $V_{DD}$. Accordingly, the bias voltage is effectively decoupled from $V_{SS}$, since the bias voltage tracks the control voltage. Thus, power supply noise present on the node of $V_{SS}$ may be effectively isolated from the bias voltage and thus does not affect the clock signal provided by VCE 202. By effectively isolating the bias voltage from $V_{SS}$, jitter from power supply noise on the node of $V_{SS}$ is minimized or eliminated. This is due to the fact that the output clock parameter (delay in VCDL or frequency in VCO) depends on the voltage across VCE 202, which is $V_{DD}-V_{bias}$.

The circuit arrangement shown in FIG. 2 may allow the bias voltage, $V_{bias}$, to be tightly coupled to $V_{DD}$. As previously noted, the control voltage provided by charge pump 104 is references only to VDD through the filter capacitor $C_f$. This allows the voltage on the bias voltage node ($V_{bias}$) to track the changes in the supply voltage, $V_{DD}$ through the control voltage and bias circuitry for frequencies lower than the bandwidth of the biasing circuit. Furthermore, the capacitor $C_{dl}$ between the bias voltage node and node of $V_{DD}$ further couples the bias voltage to $V_{DD}$ by providing a low impedance path therebetween at higher frequencies. Thus, the bias voltage, $V_{bias}$, is tightly coupled to $V_{DD}$ across all frequencies as described above. The voltage across VCE 202 ($V_{DD}-V_{bias}$) therefore remains substantially constant and hence jitter from power supply noise on $V_{DD}$ is also minimized, if not completely eliminated.

Figure 3A:
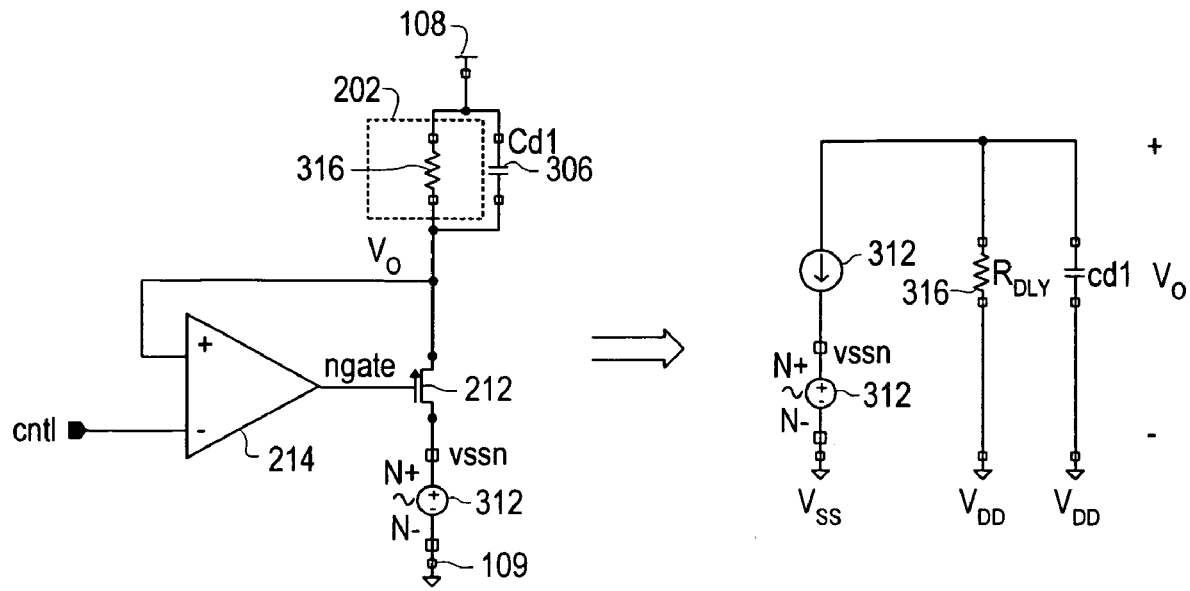
FIG. 3A is a small-signal representation of the circuit of the output unit shown in FIG. 2.

FIG. 3A is a small-signal representation of the circuit of the output unit shown in FIG. 2. In the circuit shown in FIG. 3A, VCE 202 is modeled as a single resistor 316. Biasing circuit 203, which comprises amplifier 214 and transistor 212, is modeled as current through the transistor, i.e. current source 312. Power supply noise on $V_{SS}$ ($V_{SSn}$) is modeled as voltage source 312. The voltage between the bias voltage node and VDD is referred to as $V_o$.

Current through the transistor, i.e. through current source 312 of the small signal model, is defined as $i_{ds}=g_m V_{gs}$, where $V_{gs}$ is the small signal gate-to-source voltage and $g_m$ is the transconductance of the transistor. Furthermore, $V_{gs}=(A_v V_0-V_{ssn})$, where $A_v$ is the amplifier gain, $V_o$ is the voltage on the bias voltage node (with respect to AC-ground/$V_{DD}$) and $V_{ssn}$ is the power supply noise on the node of $V_{SS}$. It is noted that VSS may be expressed as $V_{SS}=(A_V V_0-V_{ssn})$. The relationship between $V_o$ and $V_{ssn}$ may be more clearly defined by the following transfer function:

$$\frac{v_o}{v_{ssn}} \approx \frac{g_m R_{dly}}{(1 + g_m R_{dly} A_v + sC_{d1} R_{dly})}.$$

Assuming $A_v g_m R_{dly} > 1$, the equation becomes:

$$\frac{v_o}{v_{ssn}} \approx \frac{1/A_v}{(1 + sC_{d1}/g_m A_v)}.$$

Thus, a single pole exists at the frequency defined by:

$$\omega_p = \frac{g_m A_v}{C_{d1}}.$$

Figure 3B:
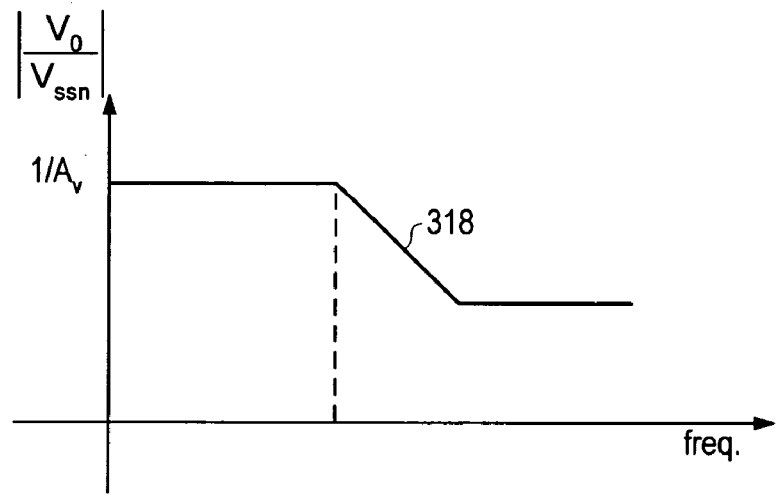
FIG. 3B is a magnitude plot of a noise transfer function of the output unit.

The behavior of the transfer function with respect to frequency is further illustrated by FIG. 3B, which is a magnitude plot of a noise transfer function of the output unit. As can be seen from the plot, for frequencies below the pole frequency, the noise transfer function yields a value of $1/A_v$. For larger values of $A_v$ (i.e. if the gain is significantly larger than unity), noise from $V_{SS}$ is largely suppressed on the bias voltage node. For frequencies above the pole frequency, the noise suppression is even greater. This is due to decoupling capacitance $C_{dl}$, which is coupled between $V_{DD}$ and the bias voltage node as described earlier. Thus, as can be seen from examining the transfer function and the noise plot of FIG. 3B, the bias voltage node is largely isolated from noise from power supply noise on the node of $V_{SS}$, with a significant increase in noise suppression above the pole frequency.

Figure 4:
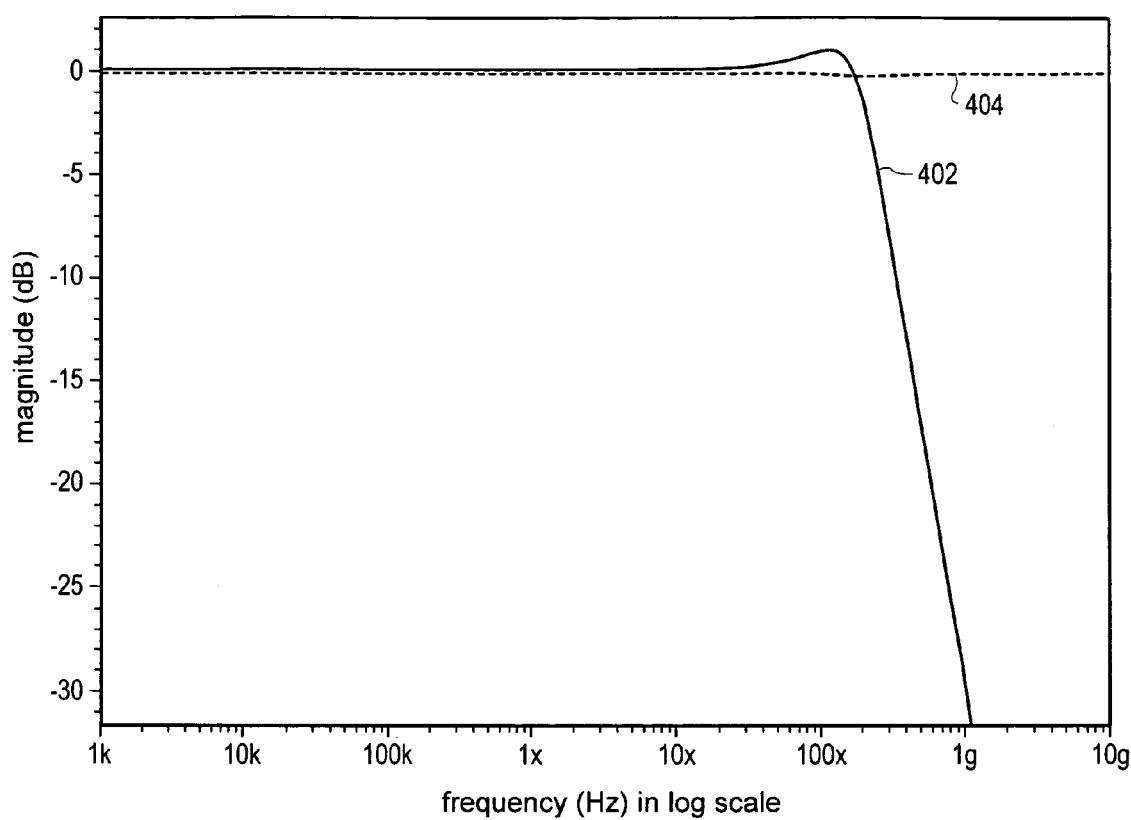
FIG. 4 is a plot of the small signal analysis resulting from a SPICE simulation of the output unit.

FIG. 4 is a plot of the small signal analysis resulting from a SPICE simulation of the output unit. Curve 402 of FIG. 4 illustrates the behavior of the input-to-output function of the control voltage to the bias voltage, which exhibits behavior similar to that of a low pass filter. Curve 404 of FIG. 4 illusturates the behavior of the bias voltage with respect to $V_{SS}$ when small signal noise is injected onto the node of $V_{DD}$. As can be seen, the voltage across the VCE remains relatively constant across the entire range of frequencies. Since the bias voltage tracks $V_{DD}$, the operation of the voltage-controlled element (VCDL or VCO) is not significantly affected by noise on $V_{DD}$, and therefore jitter is minimized if not eliminated.

The circuit described herein is configured such that it avoids the need for a bandgap circuit in order to provide a constant reference voltage to a linear voltage regulator that may be utilized in other single-ended embodiments. Instead, the embodiments of the circuit described herein take advantage of an inherent control voltage that is produced based on a phase difference between the reference clock signal and the output clock signal. This may result in a much simpler implementation than those embodiments that require a bandgap circuit in order to provide a constant reference to a linear voltage regulator. Furthermore, since the circuits described herein are single-ended circuits, the need for multiple control voltages (i.e. $V_{BP}$ and $V_{BN}$) and symmetric loads required in differential embodiments may be avoided. Furthermore, the single-ended embodiment may be able to provide clock signals with higher operating frequencies than similar differential embodiments.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A clock circuit comprising:
 a phase detector coupled to receive a reference clock signal and an output clock signal and configured to provide a phase signal indicative of a phase difference between the reference clock signal and the output clock signal; and
 an output unit configured to provide the output clock signal, wherein the output unit is coupled to a first supply voltage node and a second supply voltage node, and wherein the output unit includes:
 a biasing circuit coupled to receive a control voltage based on the phase signal and configured to generate, based on the control voltage, a bias voltage on a bias voltage node, wherein the bias voltage is decoupled from the second supply voltage node, wherein the biasing circuit includes an amplifier having an inverting input, a non-inverting input, and an output, wherein the inverting input is coupled to receive the control voltage; and
 a voltage-controlled element coupled to the first supply voltage node and the bias voltage node, and wherein the voltage-controlled element is configured to adjust a parameter of the output clock signal based on the bias voltage.

2. The clock circuit as recited in claim 1, wherein the reference clock signal, the output clock signal, the phase signal, the control voltage, and the bias voltage are each single-ended signals.

3. The clock circuit as recited in claim 1 further comprising a charge pump, wherein the charge pump is coupled to receive the phase signal and is configured to generate the control voltage based on the phase signal.

4. The clock circuit as recited in claim 3, wherein the control voltage is provided on a control voltage node, and wherein the clock circuit further includes a low-pass filter coupled between the first supply voltage node and the control voltage node.

5. The clock circuit as recited in claim 1, wherein the biasing circuit further includes a transistor, wherein a gate terminal of the transistor is coupled to the output of the amplifier, and wherein a channel of the transistor is coupled between the bias voltage node and the second supply voltage node.

6. The clock circuit as recited in claim 1, wherein the non-inverting input of the amplifier is coupled to the bias voltage node.

7. The clock circuit as recited in claim 1, further comprising a coupling capacitance coupled between the first supply voltage node and the bias voltage node.

8. The clock circuit as recited in claim 1, wherein the clock circuit is a delay locked loop, and wherein the voltage-controlled element is a voltage controlled delay line, wherein the voltage controlled delay line is coupled to receive the reference clock signal and provide the output clock signal as a delayed version of the reference clock signal, wherein an amount of delay provided is based on the bias voltage.

9. The clock circuit as recited in claim 1, wherein the clock circuit is a phase locked loop, and wherein the voltage-controlled element is a voltage-controlled oscillator, and wherein a frequency of the output clock signal is based on the bias voltage.

10. The clock circuit as recited in claim 1, wherein the clock circuit further includes a level shifting circuit coupled to receive the output clock signal from the voltage-controlled element, wherein the level shifting circuit is configured to provide the output clock signal at a shifted voltage level.

11. A delay locked loop comprising:
 a phase detector coupled to receive a reference clock signal and an output clock signal and configured to provide a phase signal indicative of a phase difference between the reference clock signal and the output clock signal;
 a voltage-controlled delay line coupled to a first supply voltage node and a bias voltage node, wherein the voltage-controlled delay line is coupled to receive the reference clock signal; and
 a biasing circuit coupled to the first supply voltage node and a second supply voltage node, wherein the biasing circuit is further coupled to receive a control voltage based on the phase signal and configured to generate a bias voltage based on the control voltage, wherein the bias voltage is decoupled from the second supply voltage node, wherein the biasing circuit includes an amplifier having an inverting input, a non-inverting input, and an output, wherein the inverting input is coupled to receive the control voltage;
 wherein the voltage-controlled delay line is configured to adjust an amount of delay of the output clock signal with respect to the reference clock signal based on the bias voltage.

12. The delay locked loop as recited in claim 11, wherein the reference clock signal, the output clock signal, the phase signal, the control voltage, and the bias voltage are each single-ended signals.

13. The delay locked loop as recited in claim 11, wherein the biasing circuit further includes a transistor, wherein a gate terminal of the transistor is coupled to the output of the amplifier, and wherein a channel of the transistor is coupled between the bias voltage node and the second supply voltage node, and wherein the non-inverting input of the amplifier is coupled to the bias voltage node.

14. The delay locked loop as recited in claim 11 further comprising a charge pump, wherein the charge pump is coupled to receive the phase signal and is configured to generate the control voltage based on the phase signal, wherein the control voltage is provided on a control voltage node, and wherein the clock circuit further includes a filter capacitance coupled between the first supply voltage node and the control voltage node.

15. A phase locked loop comprising:
 a phase detector coupled to receive a reference clock signal and an output clock signal and configured to provide a phase signal indicative of a phase difference between the reference clock signal and the output clock signal;
 a voltage controlled oscillator coupled to a first supply voltage node and a bias voltage node; and
 a biasing circuit coupled to the first supply voltage node and a second supply voltage node, wherein the biasing circuit is further coupled to receive a control voltage based on the phase signal and configured to generate a bias voltage based on the control voltage, wherein the bias voltage is decoupled from the second supply voltage node, wherein the biasing circuit includes an amplifier having an inverting input, a non-inverting input, and an output, wherein the inverting input is coupled to receive the control voltage, wherein the biasing circuit further includes a transistor, wherein a gate terminal of the transistor is coupled to the output of the amplifier, and wherein a channel of the transistor is coupled between the bias voltage node and the second supply voltage node, and wherein the non-inverting input of the amplifier is coupled to the bias voltage node;

wherein the voltage controlled oscillator is configured to generate the output clock signal based on the bias voltage.

16. The phase locked loop as recited in claim 15, wherein the reference clock signal, the output clock signal, the phase signal, the control voltage, and the bias voltage are each single-ended signals.

17. The phase locked loop as recited in claim 15, further comprising a charge pump, wherein the charge pump is coupled to receive the phase signal and is configured to generate the control voltage based on the phase signal, wherein the control voltage is provided on a control voltage node, and wherein the clock circuit further includes a filter capacitance coupled between the first supply voltage node and the control voltage node.

18. A clock circuit comprising:
- a phase detector coupled to receive a reference clock signal and an output clock signal and configured to provide a phase signal indicative of a phase difference between the reference clock signal and the output clock signal; and
- an output unit configured to provide the output clock signal, wherein the output unit is coupled to a first supply voltage node and a second supply voltage node, and wherein the output unit includes:
- a biasing circuit coupled to receive a control voltage based on the phase signal and configured to generate, based on the control voltage, a bias voltage on a bias voltage node, wherein the bias voltage is decoupled from the second supply voltage node;
- a voltage-controlled element coupled to the first supply voltage node and the bias voltage node, and wherein the voltage-controlled element is configured to adjust a parameter of the output clock signal based on the bias voltage; and
- a level shifting circuit coupled to receive the output clock signal from the voltage-controlled element, wherein the level shifting circuit is configured to provide the output clock signal at a shifted voltage level.

* * * * *